US005970607A

United States Patent [19]
Herzog

[11] Patent Number: 5,970,607

[45] Date of Patent: Oct. 26, 1999

[54] METHOD OF MAKING AN ELECTRICAL SUBASSEMBLY

[75] Inventor: Richard R. Herzog, Arlington Heights, Ill.

[73] Assignee: Illinois Tool Works Inc., Glenview, Ill.

[21] Appl. No.: 08/373,801

[22] Filed: Jan. 17, 1995

Related U.S. Application Data

[62] Division of application No. 08/300,881, Sep. 6, 1994, abandoned, which is a continuation of application No. 08/129,745, Sep. 30, 1993, abandoned.

[51] Int. Cl.[6] .................................................... H05K 13/00

[52] U.S. Cl. ................................ 29/832; 29/854; 29/881; 29/884

[58] Field of Search ............................. 29/882–884, 418, 29/881, 597, 863, 832, 854

[56] References Cited

U.S. PATENT DOCUMENTS

| | | | |
|---|---|---|---|
| 3,214,826 | 11/1965 | Valdettaro et al. | 29/884 |
| 3,763,451 | 10/1973 | Morgott | 335/206 |
| 4,264,117 | 4/1981 | Pritulsky | 439/168 |
| 4,638,559 | 1/1987 | McGonigal | 29/874 |
| 4,685,212 | 8/1987 | Masuda et al. | 29/876 |
| 5,055,704 | 10/1991 | Link | 307/66 |
| 5,105,059 | 4/1992 | Sorenson | 200/302.3 |
| 5,121,300 | 6/1992 | Shimizu | 361/421 |
| 5,138,431 | 8/1992 | Huang | 357/71 |
| 5,226,840 | 7/1993 | Wojtanek | 439/733 |
| 5,353,492 | 10/1994 | Potocnik et al. | 29/597 |

FOREIGN PATENT DOCUMENTS

| | | | |
|---|---|---|---|
| 3527206 | 7/1985 | Germany . | |
| 3527206 | 2/1987 | Germany | 361/823 |

*Primary Examiner*—Carl E. Hall
*Attorney, Agent, or Firm*—Schwartz & Weinrieb

[57] ABSTRACT

A method of making an electrical subassembly and a subassembly formed by the method which includes the steps of providing a conductive member having a predetermined configuration and a housing for receiving the conductive member, connecting the conductive member to the housing, and removing a portion of the conductive member so as to separate it into a plurality of discrete contacts, each contact being connected to the housing and thereby providing a desired circuit path through the subassembly. The subassembly includes one or more electrical components mounted thereto and can be readily attached to a support and wired to a desired circuit without soldering while enabling removal and replacement of an electrical component as desired.

19 Claims, 4 Drawing Sheets

METHOD OF MAKING AN ELECTRICAL SUBASSEMBLY

This application is a division of application Ser. No. 08/300,881, filed Sep. 6, 1994, now abandoned, which is a continuation of U.S. patent application Ser. No. 08/129,745 filed Sep. 30, 1993 now abandoned.

BACKGROUND OF THE INVENTION

1. Field of the Invention

This invention relates generally to electrical subassemblies, and more particularly, to a method of making an electrical subassembly having one or more electrical components mounted thereto wherein the subassembly can be readily attached to a support or circuit board, wired within a desired circuit without soldering, and enables at least one electrical component to be removed and replaced as desired.

The subassembly includes a housing, an electrical component and an electrical contact member wherein a portion of the contact is removed after it is connected to the housing so as to separate the contact into a plurality of smaller discrete electrical contacts. The discrete contacts together provide a desired circuit path within the subassembly for use with the electrical component and each includes quick connect terminals for wiring the subassembly to other portions of a circuit.

2. Description of the Related Art

Electrical devices typically include a plurality of electrical components and subassemblies which are arranged and electrically connected within the device so as to provide a desired function. For example, electrical devices frequently include one or more circuit boards which are mounted upon the structure of the device and can be wired to other circuit boards or a variety of other components and subassemblies such as switches, light bulbs or the like.

Some components, however, may need to be replaced after a period of time. This is particularly true with light bulbs which are typically utilized to provide a visual indication to a user of the status of the device or, in the case of an electronic game such as a pinball machine, enhance game play.

Existing devices which utilize some type of light bulb typically require soldering or a plurality of connectors as well as numerous small components. Such devices require increased assembly time and costs, provide reduced reliability and cannot be readily serviced.

It therefore would be desirable to provide a method of making an electrical subassembly having one or more electrical components, such as a light bulb, wherein the assembly can be readily attached to a circuit board or support structure and electrically wired without soldering into the desired circuit as to so significantly reduce assembly time while enabling ready replacement of the component and providing increased reliability of the connections made between the subassembly and the remainder of the circuit.

SUMMARY OF THE INVENTION

The invention provides a method for making an electrical subassembly and a subassembly formed by the method wherein the method includes providing a conductive member with a predetermined configuration and a housing for receiving the conductive member. The conductive member is connected to the housing and a portion of the conductive member is removed so as to separate the conductive member into a plurality of discrete contacts wherein each contact is connected to the housing and the contacts together provide a desired circuit path through the subassembly.

The subassembly is particularly useful with a light bulb and socket which is designed for twist-lock mounting upon the housing and electrical contact with the desired circuit. Such a subassembly can be mounted upon a support structure or circuit board of a device so as to provide a status indicator, upon enhance game play of an electronic game or for any other desired use.

BRIEF DESCRIPTION OF THE DRAWINGS

Various other objects, features, and attendant advantages of the present invention will be more fully appreciated from the following detailed description, when considered in connection with the accompanying drawings, in which like reference characters designate like or corresponding parts throughout the several views, and wherein.

DESCRIPTION OF THE PREFERRED EMBODIMENTS

Figure 1:
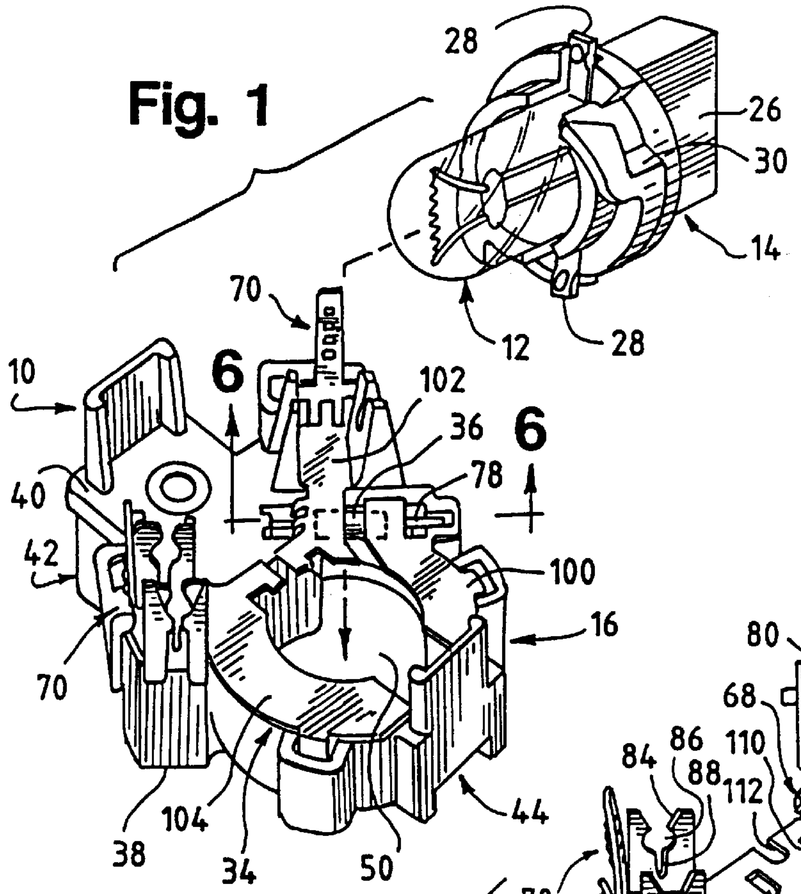
FIG. 1 is a perspective exploded view of the electrical subassembly of the invention illustrating the light bulb and socket removed from the support structure.

Referring to FIG. 1, the electrical subassembly of the invention is designated generally by the reference numeral 10. The subassembly 10 substantially includes a light bulb 12 connected to a socket 14 and a support structure 16. Although the present invention is illustrated with respect to a subassembly 10 having a light bulb 12, it is to be understood that the teachings of the present invention may also be utilized to provide a variety of electrical subassemblies.

Figure 8:
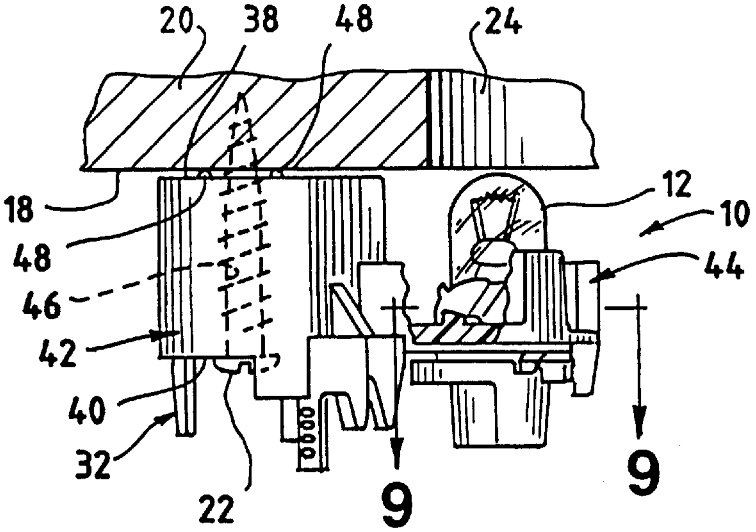
FIG. 8 is a side elevational view of the subassembly attached to a support.

As FIG. 8 illustrates, the subassembly 10 is typically connected to a bottom surface 18 of a mounting board 20 with a screw 22. The bulb 12 is positioned in alignment with an aperture 24 formed through the board 20. Thus, when illuminated, the bulb 12 shines through the aperture 24 to a top side of the board 20. If desired, the aperture 24 can be covered by a translucent member (not illustrated).

Such an assembly can be utilized in electronic games, such as pinball machines or the like, where the light bulb 12 provides illumination to desired portions of the game board. It is to be understood, however, that the subassembly 10 can be utilized in a variety of applications.

As FIG. 1 substantially illustrates, the light bulb 12 is preferably a "wedge base" type of bulb having contacts (not illustrated) which provide a snap-type engagement with the socket 14. The particular type of bulb 12, however, can vary.

The socket 14 is preferably designed for "twist-lock" engagement with the support structure 16 and includes a base 26, contacts 28 and engagement/locking ramps 30. Details of the engagement of the socket 14 and the support structure 16 will be provided below.

Figure 2:
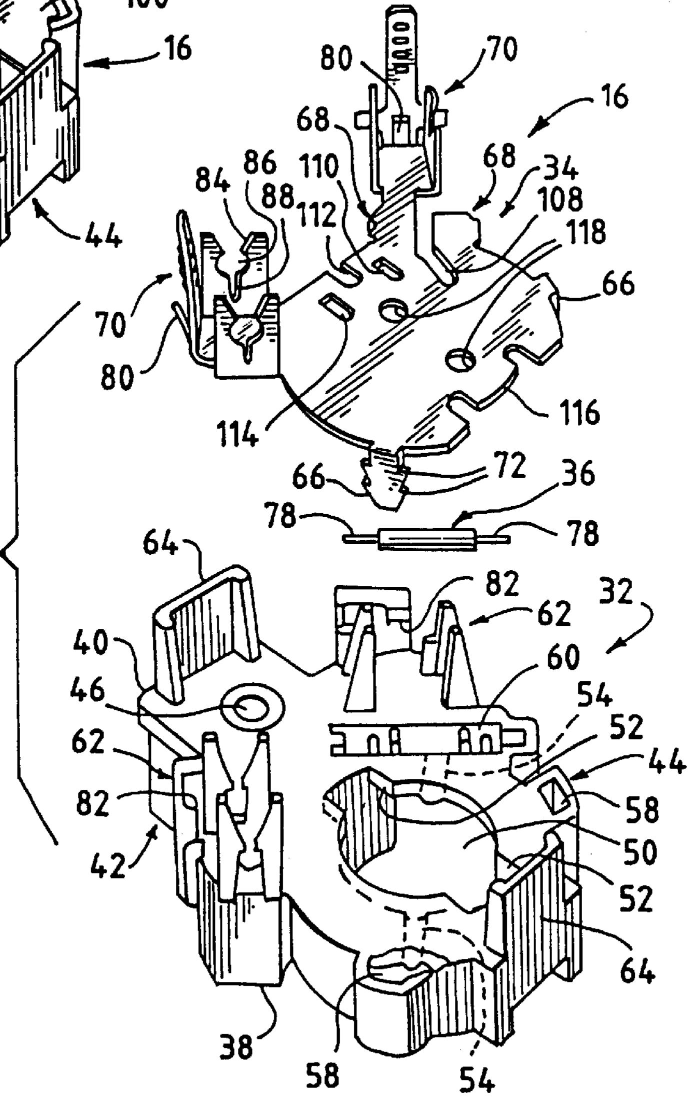
FIG. 2 is a perspective exploded view of the support structure of FIG. 1 illustrating the housing and contact member.
Figure 3:
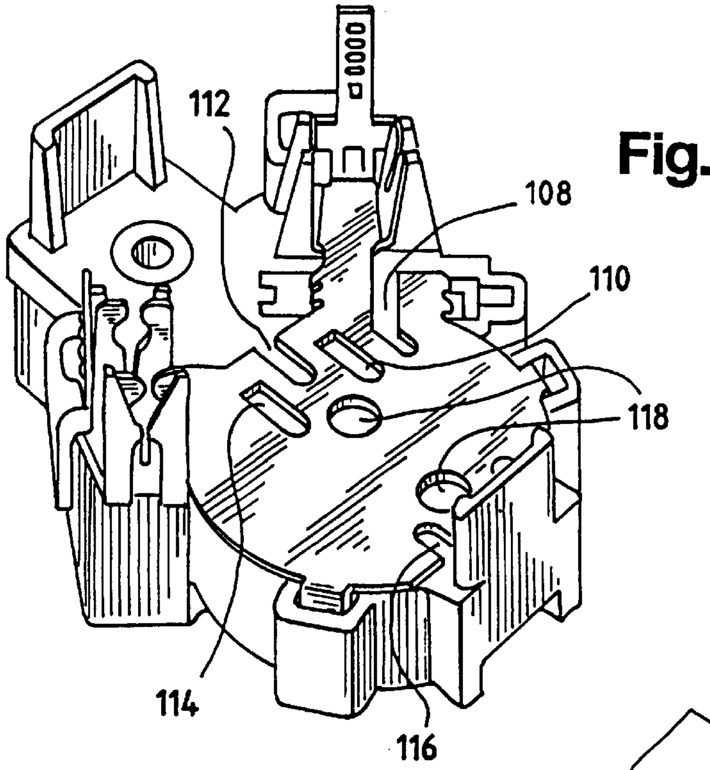
FIG. 3 is an enlarged perspective view of the assembled housing and contact member of FIG. 2.

As FIG. 2 illustrates, the support structure 16 includes a plastic housing 32 having a predetermined configuration and a conductive contact member 34 having a predetermined configuration and connected to the housing 32 as described below. Additionally, an electrical component 36, such as a diode, resistor or the like, can be included with the support structure 16 if desired. It is to be noted that the particular size, shape and material of the housing 32 and contact 34 can vary so long as they function as described herein.

The housing 32 serves to connect the completed subassembly 10 to the board 20, provide a twist-lock type removable connection with the socket 14, and electrically connect the bulb 12 to a desired circuit through the contact 34. The housing 32 includes a first side 38 for engagement with the board 20, a second side 40 for engagement and attachment of the contact 34 and socket 14, a standoff portion 42, and a socket connector portion 44.

As FIG. 8 illustrates, the standoff portion 42 includes an aperture 46 therethrough for accepting the screw 22 and attaching the housing 32 to the board 20. The particular shape of the standoff portion 42 can vary so long as it provides mounting of the screw 22 and the desired support.

In order to prevent rotation of the housing 32 with respect to the board 20 during installation of the screw 22, the standoff 42 includes at least one substantially sharp projection 48 proximate the aperture 46 for engagement with the board 20. Preferably, four projections 48 are provided and are spaced about the aperture 46, but the number and type of projections can vary.

With reference to FIGS. 1 and 2, the socket 14 is connected to the socket portion 44 from the second side 40 of the housing 32 with a twist-lock type of connection. Accordingly, the bulb 12 is first inserted through a bulb aperture 50 formed through the socket portion 44.

Figure 9:
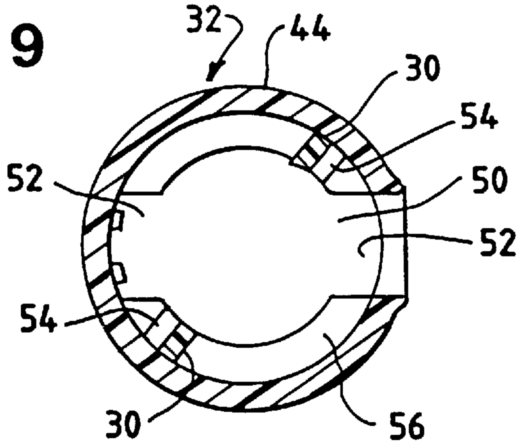
FIG. 9 is an enlarged cross-sectional view taken along line 9—9 of FIG. 8 in the direction indicated illustrating the twist-lock mounting structure for the light bulb socket.

In order to align the socket ramps 30 of the socket 14 with respect to the aperture 50, the aperture 50 includes cut outs 52 formed on opposite sides thereof. The cut outs 52 enable the ramps 30 to extend through the aperture 50 to the first side 38 of the housing 32 for twist-lock engagement with bumps or ribs 54. The ribs 54 are formed on opposite sides of the aperture 50 about a shoulder 56, as illustrated in detail in FIG. 9.

Thus, to connect the socket 14 to the housing 32, the bulb 12 is extended through the aperture 50 to the first side 38 of the housing 32 and the ramps 30 engage the shoulders 56. Upon clockwise rotation of the socket 14 with respect to FIG. 1 the ramps 30 snap over the ribs 54 so as to provide the desired twist-lock with the bulb contacts 28 in contact with the contact 34 on the second side 40 of the housing 32.

As FIG. 2 illustrates, the second side 40 of the housing 32 preferably includes two connector pockets 58, an electrical component recess 60, two wiring connector portions 62, and two tool guide portions 64. The contact 34 is designed for complementary engagement with the housing 32 and includes two connection portions 66, electrical component holders 68, and two wiring connectors 70.

The contact 34 is snap-engaged with the housing 32 in several positions. To initially connect the contact 34 to the housing 32, the connection portions 66 of the contact 34 include barbs 72 which engage a shoulder (not illustrated) on the interior of the connector pockets 58 of the housing 32. Thus, upon insertion of the connection portions 66 within the pockets 58, the barbs 72 snap into engagement behind the shoulders so as to provide connection therebetween.

Figure 6:
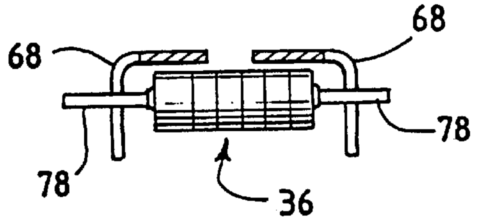
FIG. 6 is an enlarged side elevational view of a portion of the support structure taken along line 6—6 of FIG. 1 in the direction indicated illustrating an electrical component mounted therein.
Figure 7:
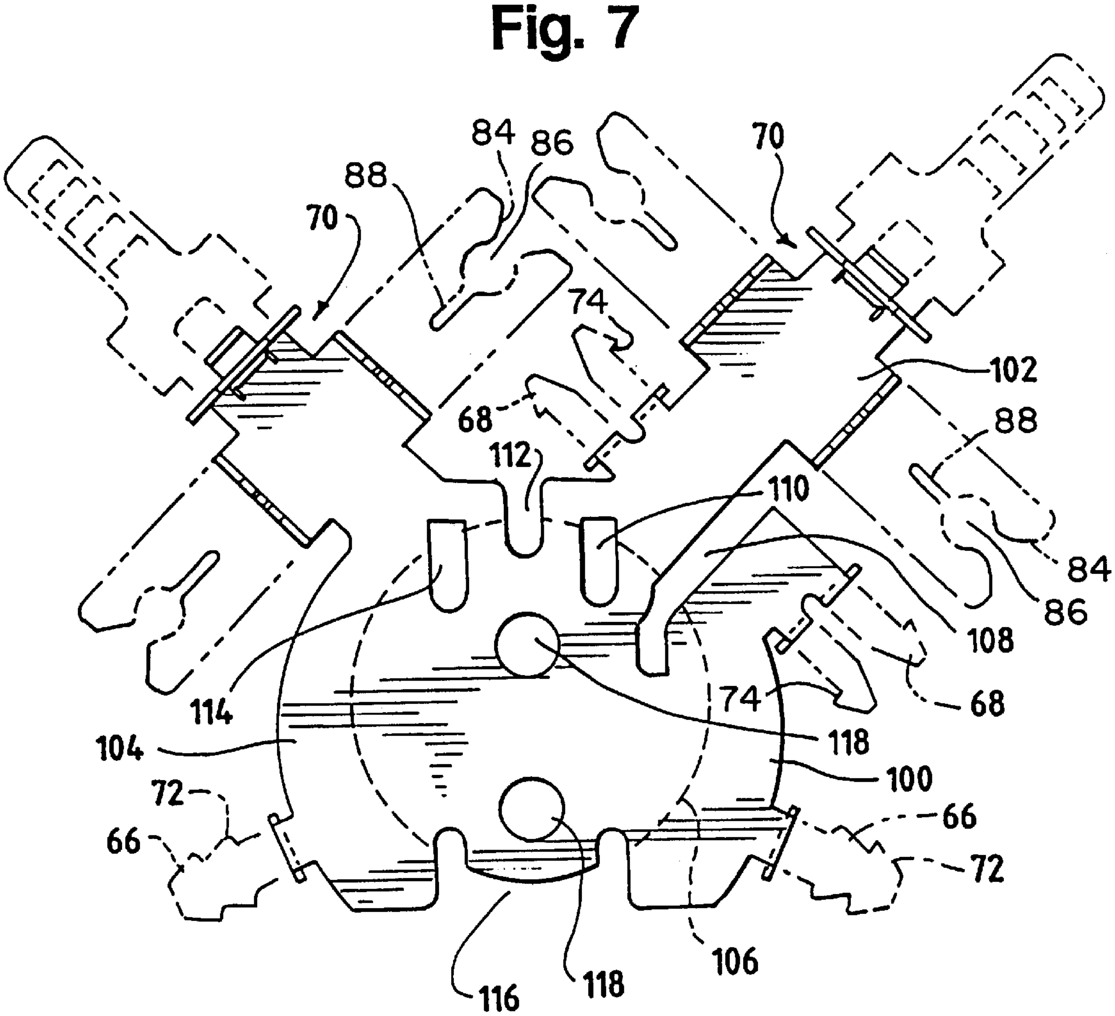
FIG. 7 is an enlarged top plan view of the stamped and formed contact member of FIG. 2, illustrated in solid lines, with the original outline of the stamped contact member before forming illustrated in dotted lines.

To provide an additional connection between the contact 34 and the housing 32, the component holders 68 of the contact 34 similarly include barbs 74 for engagement with a shoulder (not illustrated) within the component recess 60 of the housing 32. The component holders 68 also serve to hold the electrical component 36 within the recess 60 and provide electrical contact with the component 36 and the desired circuit. Preferably, as FIG. 7 illustrates in dotted lines, the component holders 68 are U-shaped to surround, hold and contact leads 78 of the component 36 while FIG. 6 illustrates the holding of the leads 78 by the component holders 68.

The wiring connectors 70 of the contact 34 cooperate with the wiring connector portions 62 of the housing 32 to provide further connection between the contact 34 and the housing 32. The wiring connectors 70 of the contact 34 also define insulation displacement type connectors having an initial wire retention area and provide quick-connect male terminals for additional wiring capability.

Thus, the contact 34 and housing 32 enable a user to attach wires to the subassembly 10 and make any adjustments prior to displacing the wire insulation. These components also enable groups of subassemblies 10 to be wired together at the same time, with one or more wires, prior to the insulation displacement or "setting" of the wires in the insulation displacement connectors. Both of these features are very desirable in manufacturing.

As FIG. 2 illustrates, each wiring connector 70 of the contact 34 includes a tab 80 for snap engagement with a shoulder 82 formed on the wiring connector portion 62 of the housing 32. Thus, upon insertion of the contact 34 within the housing 32, the tabs 80 snap into engagement with the shoulders 82 so as to secure the wiring connectors 70 within the wiring connector portions 62.

Figure 5:
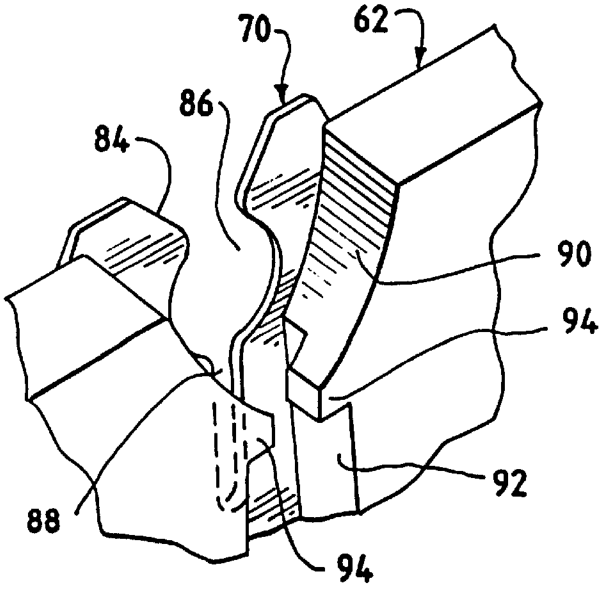
FIG. 5 is an enlarged perspective view of the housing portion of FIG. 4 illustrating the contact member connected thereto.

As FIGS. 2 and 5 illustrate, each wiring connector 70 of the contact 34 is formed to include an initial wire receiving channel 84, an arcuate wire holding portion 86 and a narrow wire engagement slot 88. A wire (not illustrated) is inserted through the channel 84 and into the arcuate portion 86 which provides initial wire retention without displacing the wire insulation so that the wire can be pre-positioned as desired. The wiring connector portion 62 of the housing 32 includes an initial recess 90 and a final recess 92 which cooperate with the wiring connector 70.

Upon insertion into the slot 88, the sides of the slot cut through the wire insulation and provide electrical contact between the contact 34 and the wire. In order to restrict pulling out of the wire from the slot 88, the wiring connector portion 62 of the housing 32 includes projections 94 on either side of the slot 88 which extend a slight distance across the recess 92.

Figure 4:
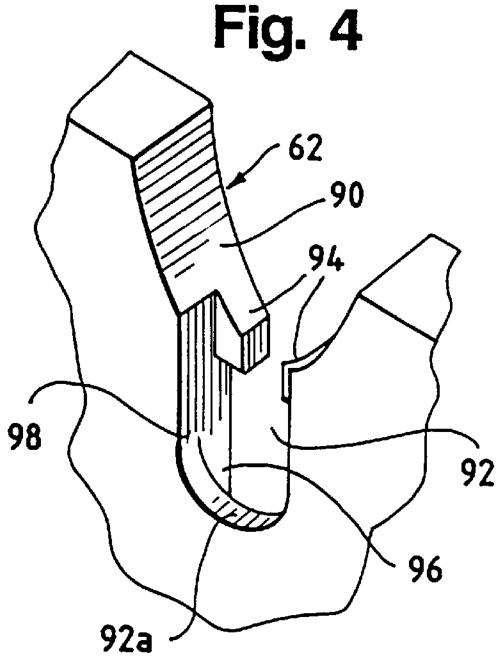
FIG. 4 is an enlarged perspective view, in partial section, of a portion of the housing of FIG. 2.

It is to be noted that the final recess 92 and projections 94 of the housing 32 are molded from a two-plate mold, as opposed to a bank or side action mold, in order to keep part and tooling costs to a minimum. Thus, as FIG. 4 illustrates, an exterior channel 96 and an interior channel 98 are formed on respective outside and inside portions of the connector portion 62 by sliding shut-offs (not illustrated.) The sliding shut-offs approach each other from opposite directions and contact each other in the area between the projections 94 and a bottom **92*a* of the final recess 92 so as to substantially form the recess 92 through the connector portion 62**.

As FIG. 7 illustrates, the contact 34 is initially provided as a single planar piece as illustrated in dotted lines about the periphery of the contact 34. Preferably, one or more individual contacts 34 are stamped from a single piece of conductive metal, such as copper, and are formed or bent into the shape illustrated in solid lines and in FIG. 2.

Figure 10:
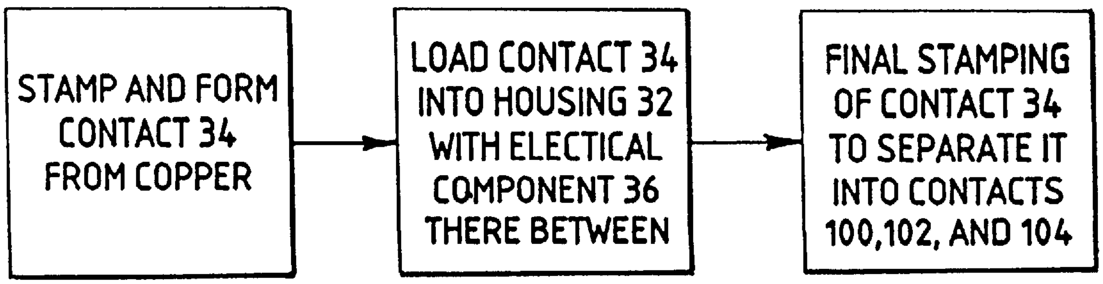
FIG. 10 is a schematic illustration of the method utilized to form the subassembly of the present invention.

The contact 34 is not only stamped to provide the connection portions 66, electrical component holders 68, and wiring connectors 70, but is also relieved at selected portions so as to enable the contact 34 to be severed after assembly and thereby the housing 32 to provide a plurality of discrete contacts. As FIG. 10 illustrates, the contact 34 is preferably stamped and formed from copper, connected to the housing 32 with the component 36 as described above, and finally stamped or punched to form first, second and third separate contacts 100, 102 and 104 as illustrated in FIGS. 1 and 7. Separating the contact 34 after assembly to the housing 32 dramatically reduces assembly time and costs as opposed to individually mounting the much smaller contacts 100, 102 and 104.

As FIG. 7 illustrates, the contact 34 is punched along a circular line 106 (illustrated in dotted lines) which intersects relieved portions 108, 110, 112, 114 and 116 formed at selected positions about the contact 34. It is to be noted that the particular size, shape and positioning of the line 106 and relieved portions 108–116 can vary so as to provide a variety of different circuit designs within the subassembly 10. To assist in alignment and gripping of the contact 34 during assembly and punching, apertures 118 can also be included therethrough.

As FIG. 1 illustrates, when the socket 14 is assembled to the support structure 16, the first contact 100 provides an electrical connection between a contact 28 of the socket 14 and one lead 78 of the electrical component 36. The second contact 102 provides electrical contact between the other lead 78 of the electrical component 36 and one of the wiring connectors 70. Finally, the third contact 104 provides electrical contact between the other contact 28 of the socket 14 and the other wiring connector 70.

To assemble the subassembly 10 to an electronic device, the screw 22 is inserted through the housing 32 and connects the subassembly 10 to the board 20. Wires (not illustrated) are then initially inserted within the arcuate apertures 86 of the wiring connectors 70. A wire installation tool (not illustrated) is then utilized to finally set all the wires simultaneously within the slots 88 of the wiring connectors 70 so as to displace the wire insulation, and make the desired electrical connections. The tool guide portions 64 of the housing 32 can be utilized to guide and align the wire installation tool, if desired.

Accordingly, as FIG. 8 illustrates, when a bulb 12 burns out, the socket 14, is merely rotated to remove the socket 14 and bulb 12 from the subassembly 10 without disturbing the wiring of the device. The bulb 12 can then be replaced and the socket 14 and new bulb 12 reconnected to the subassembly 10. This entire procedure can be accomplished without any soldering or reconnecting of wires.

Modifications and variations of the present invention are possible in light of the above teachings. It is therefore to be understood that within the scope of the appended claims the invention may be practiced other than specifically described.

What is claimed and desired to be secured by Letters Patent is:

1. A method of making an electrical subassembly, comprising the steps of:

providing a conductive member having a predetermined configuration and defining a plurality of electrical contact members thereon;

providing a housing having a predetermined configuration for receiving said conductive member thereon, and having a recess defined therein;

inserting an electrical component within said recess defined within said housing;

mounting said conductive member upon said housing such that at least one of said plurality of electrical contact members captures said electrical component and secures said electrical component with respect to said housing while establishing electrical contact with said electrical component; and removing a single portion of said conductive member so as to separate said pluralitv of electrical contact members of said conductive member into at least three discrete electrical contact members as a result of said removal of said single portion of said conductive member wherein each one of said at least three discrete electrical contact members is connected to said housing and together define a desired circuit path through said subassembly.

2. The method as set forth in claim 1, further comprising the step of:

punching and forming predetermined portions of said conductive member so as to define snap-connecting means for achieving said mounting of said conductive member upon said housing, and to further define means for quick-connecting a desired number of wires to said discrete contact members.

3. The method as set forth in claim 1, wherein:

said electrical component comprises a diode.

4. The method as set forth in claim 1, wherein:

said electrical component comprises a resistor.

5. The method as set forth in claim 1, wherein:

said conductive member, from which said plurality of discrete electrical contact members are formed, is fabricated from copper.

6. The method as set forth in claim 1, further comprising the steps of:

fabricating said conductive member, from which said plurality of discrete electrical contact members are formed, as a single planar piece which includes barbed connection portions for engaging connector pockets of said housing so as to achieve said mounting of said conductive member upon said housing; and bending said barbed connection portions out of the plane of said single planar piece comprising said conductive member so as to extend substantially perpendicular to said plane of said single planar piece and thereby permit said engagement of said barbed connection portions with said connector pockets of said housing.

7. The method as set forth in claim 1, further comprising the steps of:

fabricating said conductive member, from which said plurality of discrete electrical contact members are formed, as a single planar piece which includes barbed connection portions for engaging said recess of said housing so as to secure said electrical component within said recess of said housing; and bending said barbed connection portions out of the plane of said single planar piece comprising said conductive member so as to extend substantially perpendicular to said plane of said single planar piece and thereby permit said engagement of said barbed connection portions within said recess of said housing and said capture of said electrical component disposed within said recess of said housing.

8. The method as set forth in claim 2, further comprising the steps of:

fabricating said conductive member, from which said plurality of discrete electrical contact members are formed, as a single planar piece which includes insulation displacement wiring connectors having snap engagement tabs for snap engagement with shoulder means of said housing so as to secure discrete contact members to said housing and to provide for said quick-connection of said wires to said discrete contact members; and bending said insulation displacement wiring connectors and said snap engagement tabs out of the plane of said single planar piece comprising said conductive member so as to extend substantially perpendicular to said plane of said single planar piece and thus permit said snap engagement of said snap engagement tabs with said shoulder means of said housing and said quick-connection of said wires to said discrete contact members.

9. The method as set forth in claim 8, further comprising the step of:

mounting an electrical element socket upon said housing such that said desired circuit path through said subassembly electrically comprises a first one of said plurality of discrete electrical contact members electrically interconnecting said electrical element socket to said electrical component, a second one of said plurality of discrete electrical contact members electrically interconnecting said electrical component to a first one of said wiring connectors, and a third one of said plurality of discrete electrical contact members electrically interconnecting a second one of said wiring connectors to said socket.

10. A method of making an electrical subassembly, comprising the steps of:

providing a conductive member having a predetermined configuration and outer edge portions;

providing a housing having a predetermined configuration for receiving said conductive member thereon, and having a recess defined therein;

inserting an electrical component within said recess defined within said housing;

providing cut-out portions upon said conductive member such that said cut-out portions extend inwardly from said outer edge portions and define a plurality of electrical contact members upon said conductive member;

mounting said conductive member upon said housing such that two of said plurality of electrical contact members capture said electrical component and secure said electrical component with respect to said housing while establishing electrical with said electrical component; and removing a portion of said conductive member along a locus which intersects said cut-out portions of said conductive member so as to separate said plurality of electrical contact members of said conductive member into a plurality of discrete electrical contact members wherein each one of said discrete electrical contact members is connected to said housing and together define a desired circuit path through said subassembly.

11. The method as set forth in claim 10, wherein:

said locus comprises a substantially circular locus which annularly surrounds a central portion of said conductive member which comprises said portion of said conductive member removed from said conductive member; and said cut-out portions of said conductive member comprise a plurality of substantially radially extending, circumferentially spaced slots which are transversely crossed by said circular locus such that when said central portion of said conductive member is removed, said conductive member is divided into said plurality of discrete electrical contact members.

12. The method as set forth in claim 10, further comprising the step of:

punching and forming predetermined portions of said conductive member so as to define snap-connecting means for achieving said mounting of said conductive member upon said housing, and to further define means for quick-connecting a desired number of wires to said discrete contact members.

13. The method as set forth in claim 10, wherein:

said electrical component comprises a diode.

14. The method as set forth in claim 10, wherein:

said electrical component comprises a resistor.

15. The method as set forth in claim 10, wherein:

said conductive member, from which said plurality of discrete electrical contact members are formed, is fabricated from copper.

16. The method as set forth in claim 10, further comprising the steps of:

fabricating said conductive member, from which said plurality of discrete electrical contact members are formed, as a single planar piece which includes barbed connection portions for engaging connector pockets of said housing so as to achieve said mounting of said conductive member upon said housing; and bending said barbed connection portions out of the plane of said single planar piece comprising said conductive member so as to extend substantially perpendicular to said plane of said single planar piece and thereby permit said engagement of said barbed connection portions with said connector pockets of said housing.

17. The method as set forth in claim 10, further comprising the steps of:

fabricating said conductive member, from which said plurality of discrete electrical contact members are formed, as a single planar piece which includes barbed connection portions for engaging said recess of said housing so as to secure said electrical component within said recess of said housing; and bending said barbed connection portions out of the plane of said single planar piece comprising said conductive member so as to extend substantially perpendicular to said plane of said single planar piece and thereby permit said engagement of said barbed connection portions within said recess of said housing and said capture of said electrical component disposed within said recess of said housing.

18. The method as set forth in claim 12, further comprising the steps of:

fabricating said conductive member, from which said plurality of discrete electrical contact members are formed, as a single planar piece which includes insulation displacement wiring connectors having snap engagement tabs for snap engagement with shoulder means of said housing so as to secure said discrete contact members to said housing and to provide for said quick-connection of said wires to said discrete contact members; and bending said insulation displacement wiring connectors and said snap engagement tabs out of the plane of said single planar piece comprising said conductive member so as to extend substantially perpendicular to said plane of said single planar piece and thus permit said snap engagement of said snap engagement tabs with said shoulder means of said housing and said quick-connection of said wires to said discrete contact members.

19. The method as set forth in claim 8, further comprising the step of:

mounting an electrical element socket upon said housing such that said desired circuit path through said subassembly electrically comprises a first one of said plurality of discrete electrical contact members electrically interconnecting said electrical element socket to said electrical component, a second one of said plurality of discrete electrical contact members electrically interconnecting said electrical component to a first one of said wiring connectors, and a third one of said plurality of discrete electrical contact members electrically interconnecting a second one of said wiring connectors to said socket.

* * * * *